United States Patent [19]
Takiyama et al.

[11] Patent Number: 5,021,465
[45] Date of Patent: Jun. 4, 1991

[54] PHOTOCURABLE RESIN COMPOSITION AND METHOD OF PRODUCING DECORATIVE MATERIAL USING THE SAME

[75] Inventors: Eiichiro Takiyama, Kamakura; Katsuhisa Morita, Takasaki, both of Japan

[73] Assignee: Showa Highpolymer Co., Ltd., Tokyo, Japan

[21] Appl. No.: 204,266

[22] Filed: Jun. 9, 1988

[51] Int. Cl.$^5$ .............................................. C08F 124/00
[52] U.S. Cl. ........................................ 522/60; 522/62; 522/81; 522/168; 522/169; 526/266; 526/270; 526/320
[58] Field of Search ............... 522/169, 168, 81, 60, 522/62

[56] References Cited

U.S. PATENT DOCUMENTS

| | | | |
|---|---|---|---|
| 3,948,740 | 4/1976 | Phalangas | 522/62 |
| 3,993,663 | 11/1976 | Takiyama et al. | 522/169 |
| 4,024,296 | 5/1977 | Gruber | 522/81 |
| 4,199,421 | 4/1980 | Kamada et al. | 522/168 |
| 4,269,869 | 5/1981 | Morohashi et al. | 522/169 |

Primary Examiner—Marion E. McCamish
Assistant Examiner—Susan Berman
Attorney, Agent, or Firm—Oblon, Spivak, McClelland, Maier & Neustadt

[57] ABSTRACT

A photocurable resin composition comprising:
(A) a curable polymer or oligomer having one or more (metha)acryloyl groups in its molecule;
(B) a white pigment;
(C) a radical-generating compound having a decomposition temperature of 60° C. or lower at a half-life of 10 hours; and
(D) a photo-initiator, as occasion demands, and a method of producing a decorative material using this resin composition.

8 Claims, No Drawings

PHOTOCURABLE RESIN COMPOSITION AND METHOD OF PRODUCING DECORATIVE MATERIAL USING THE SAME

BACKGROUND OF THE INVENTION

The present invention relates to a photocurable resin composition, and particularly to a photocurable resin composition which is capable of photocuring even if it contains a white pigment such as titanium white. The present invention also relates to a method of producing a decorative material with excellent whiteness which has a light colored coating based on a pure-white color to a white color formed on a substrate, particularly a non-white inorganic substrate composed of cement, by using the photocurable resin. The present invention further relates to a method of producing a decorative material with excellent whiteness and hiding power which has a desired pattern or color tone transferred from a printed film to the above-described white decorative material, and particularly a decorative material which is useful for applications to building materials and decorative members.

When a coating material containing a large amount, for example, 10% or more, of white pigment such as titanium white is used in a photocuring system, the ultraviolet absorption range of the titanium white overlaps the range of wavelengths in which a initiator used for photocuring is decomposed and thus the photocuring is significantly inhibited. In order to prevent this inhibition, a photocuring system using a thioxanthone-based initiator and a amine sensitizer in combination is brought into practical use.

This system is effective, however, when the concentration of titanium white is not so high, but regretably has a problem in that, when a sensitizer is used in an amount that can effect curing, the system is yellowed, and thus a pure white coating cannot be obtained.

BASF AG. of West Germany has recently reported that the use of acylophosphine oxide enables photocuring even if titanium white is mixed in (refer to, for example, Japanese Patent Publication No. 8047.1985 and Japanese Patent Laid-Open No. 15471/1980). This sort of initiator produces improvements whereby the whiteness and the curing property of a coating in which titanium white is mixed are more excellent than with conventional initiators.

However, it is also apparent that, if titanium white is mixed in a high concentration, for example, 20% or more, curing is significantly inhibited, and a sufficient curing property cannot be obtained.

A method is also known in which a surface of a substrate, particularly an inorganic substrate composed of cement, is coated with a photocuring resin which is then subjected to photocuring so that the surface properties are improved. However, when a large amount (for example, 10% or more) of white pigment such as titanium white is used in a photocuring system for the purpose of obtaining a non-white base with a light color coating based on a pure white to white color, photocuring is significantly inhibited because the ultraviolet absorption range of the titanium white overlaps the wavelength range in which a photocuring initiator is decomposed.

In addition, a method is known in which a surface of a substrate such as a plastic product or an inorganic base is coated with a curable resin, and the printed surface of a film on which a desired pattern or a color tone is printed is made to adhere to the surface before the resin is cured, and then the curable resin is cured so that the pattern or color tone is transferred to the surfaces of the curable resin. However, when a non-white substrate is used, the tone of the substrate affects the pattern or color tone transferred, and thus a desired pattern or color tone often cannot be obtained. In such a case, the surface of the non-white substrate is generally coated with a white resin, and then subjected to transfer of the pattern or color tone to obtain a product with a pattern or color tone which exhibits excellent hiding power.

Recent improvements in a photocuring technique enable the use of a photocurable resin in the transfer of a pattern or tone so that the curing speed is increased. However, if a non-white substrate is coated with a photocurable resin in which a large amount (for example, 10% or more) of white pigment such as titanium white is mixed and then subjected to transfer, the photo-setting is remarkably hindered because the ultraviolet absorption range of the titanium white overlaps the wavelength range in which a photo initiator is decomposed, and thus a good product cannot be obtained.

SUMMARY OF THE INVENTION

The present invention provides a resin composition which contains a large amount (for example, 10% or more) of white pigment such as titanium white and which enables the photocuring in a very short time of a (meth)acryloyl group-containing polymer or oligomer which cannot be cured by a usual photo-initiator or cannot be sufficiently cured thereby.

It is an object of the present invention to provide photocuring in a very short time of the coating of a photocurable resin composition which contains a large amount (for example, 10% or more) of white pigment such as titanium white, which is composed of a (meth)acryloyl group-containing polymer or oligomer which cannot be cured by a usual photo-initiator or cannot be sufficiently cured thereby, and which is formed on a non-white inorganic substrate in order to obtain a decorative material comprising the non-white inorganic substrate and a light color coating based on a pure white to white color.

The present invention also provides a process where a decorative material with a pattern or color tone which exhibits excellent whiteness and hiding power is produced by coating a non-white inorganic substrate with a photocurable resin of a light color based on a pure white to white color, causing a printed film to adhere to the coating, and then photocuring the photocurable resin to perform transfer, characterized by coating the substrate with a photocurable resin which contains a large amount (10% or more) of white pigment such as titanium white and which is mainly composed of a (meth)acryloyl group-containing polymer or oligomer, causing the printed film to adhere to the coating, and then photocuring the photocurable resin within a very short time.

In other words, a resin composition of the present invention which can be cured comprises the following three components in combination:
(A) curable polymers or oligomers which contain one or more (meth)acryloyl groups per molecule;
(B) a white pigment;
(C) a radical-generating compound having a decomposition temperature of 60° C. or lower at a half-life of 10 hour; and further comprises (D) a photo-initiator as occasion demands.

In particular, the present invention has been achieved on the basis of the finding that the use of a compound such as an azo compound or an organic peroxide which has a decomposition temperature of 60° C. or lower at a half-life of 10 hours and which can generate radicals enables photocuring in a short time even if a large amount of white pigment is present.

The aforementioned object of the present invention is achieved by coating the surfaces of a non-white inorganic substrate with the photocurable resin composition, and then photocuring it.

The present invention also provides a method of producing a decorative material with a pattern or color tone which is characterized by coating a surface of the non-white inorganic substrate with the photocurable resin composition and causing the printed surface of a printed film on which a desired pattern or color tone is printed to adhere to the coating or coating the printed film with the photocurable resin composition, causing the film to adhere to the substrate, and then photocuring the photocurable resin so that the pattern or color tone printed on the film is transferred to the surface of the set resin.

DETAILED DESCRIPTION OF THE INVENTION

In the present invention, the photocuring of a (meth) acryloyl group-containing oligomer or polymer can be inexplicably performed within a short time by using a radical-generating compound having a decomposition temperature of 60° C. or lower at a half-life of 10 hours but having no ability to cure sufficiently this polymer or oligomer by heating within a short time in combination with a white pigment. Although the reason for this is not known yet, it can be conjectured that the compound which can generate radicals is subjected to photodecomposition by the ultraviolet rays applied thereto, as well as thermal decomposition by the heat generated from an ultraviolet light generating apparatus, and that the ultraviolet ray effect and the thermal effect combined exhibit a synergistic effect.

Examples of compounds which can generate radicals and have a half-life temperature of 60° C. or lower include azo compounds and organic peroxides. Typical examples of azo compounds include 2,2'-azobis(4-methoxy-2,4-dimethylvaleronitrile) (half-life temperature: 30° C.) and 2,2'-azobis(2,4-dimethylvaleronitrile) (half-life temperature: 51° C.)

Preferred examples of organic peroxides include peroxyesters and peroxycarbonates such as the following compounds:

Acetylcyclohexyl sulfonyl peroxide (half-life temperature: 26.5° C.), isobutyryl peroxide (32.5° C.), cumyl peroxyneodecanoate (36.3° C.), diisopropyl peroxydicarbonate (40.5° C.), diallyl peroxydicarbonate (38.8° C.), di-n-propyl peroxydicarbonate (40.5° C.), dimyristyl peroxydicarbonate (40.9° C.), di(2-ethoxyethyl) peroxydicarbonate (43.4° C.), di(methoxyisopropyl) peroxydicarbonate (43.4° C.), di(2-ethylhexyl) peroxydicarbonate (43.5° C.), t-hexyl peroxyneohexanoate (44.7° C.), t-butyl peroxyneohexanoate (46.5° C.), di(3-methyl-3-methoxybutyl) peroxydicarbonate (46.5° C.), t-butyl peroxyneodecanoate (46.5° C.), t-hexyl peroxyneohexanoate (51.3° C.), t-butyl peroxyneohexanoate (53° C.), t-hexyl peroxypivalate (53.2° C.), t-butyl peroxypivalate (55° C.), and bis(4-t-butylcyclohexyl) peroxydicarbonate (44° C.).

Considering the storing property of a mixture, the speed of curing, and the properties with respect to handling of organic peroxides at room temperature, typical examples which can be practically used include peroxycarbonates, particularly bis(4-t-butylcyclohexyl) peroxydicarbonate (trade name: Parcadox #16, produced by Kayaku Nuri Co., Ltd.).

As a matter of course, the compounds that can generate radicals are not limited to these typical examples. The amount of the compound used is 0.03 to 5 parts by weight, preferably 0.1 to 2 parts by weight, relative to 100 parts by weight of a (meth)acryloyl group-containing polymer or oligomer. The use of the compound in an amount smaller than this range makes photocuring difficult, and the use of the compound in an amount larger than this range dose not produce an effect in proportion to the usage, produces foaming, and thus is not suitable.

High-temperature decomposable compounds such as benzoyl peroxide and azobisisobutyronitrile which have half-life temperatures higher than 60° C. and can generate radicals exhibit poor effects and therefore cannot be used.

The curable polymer or oligomer which contains one or more (meth)acryloyl groups in its molecule is a radical curable polymer or oligomer having a molecular weight within the range of 200 or more, preferably 500 or more, to 200,000, preferably 100,000. Typical examples are given below.

(a) Vinyl ester resin (epoxy-(meth)acrylate)

This is an oligomer which is obtained by reacting an epoxy resin with (meth)acrylic acid in such a manner that the moles of epoxy groups and the moles of carboxyl groups are substantially equivalent.

Typical examples of the epoxy resin include bisphenol diglycidyl ether-type resins, novolak polyglycidyl ether-type resins, polybasic acid polyglycidyl ester-type resins, and epoxy resins obtained by oxidation of the double bonds in their molecules with peracetic acid.

Polyurethane-(meth)acrylate

This is an oligomer which is synthesized by using an unsaturated monohydric alcohol containing hydroxyl groups and (meth)acryloyl groups in its molecule and a polyisocyanate compound, and, if required, a polyether polyol or a polyester polyol.

Examples of the unsaturated monohydric alcohol include 2-hydroxyethyl acrylate, 2-hydroxypropyl acrylate, 2-hydroxypropyl methacrylate, and 2-hydroxyethyl methacrylate.

Examples of the polyisocyanate compound include tolylene diisocyanate, hexamethylene diisocyanate, diphenylmethane diisocyanate, isophorone diisocyanate, 1,5-naphthylene diisocyanate, and polyisocyanates of polyhydric phenols.

(c) Polyester-(meth)acrylate

This is an oligomer which is synthesized by condensation of (meth)acrylic acid, any desired polybasic acid, and a polyhydric alcohol, and which can also be synthesized by an ester interchange method using an (meth)acrylate or by reacting glycidyl (meth)acrylate with a polyester containing terminal carboxyl groups.

Polybasic acids and polyhydric alcohols that may be used are not particularly limited. Typical examples include maleic acid, fumaric acid, terephthalic acid, isophthalic acid, ethylene glycol, propylene glycol, butanediol, and neopentyl glycol which are usually used as raw materials for polyester resins.

(d) Spiroacetal-(meth)acrylate

This is an oligomer which can be obtained by reacting diallylidene pentaerythritol with an unsaturated monohydric alcohol having a hydroxyl group and a (meth)acryloyl group in its molecule and which has spiroacetal structures in its molecular structure.

Examples that may be used as the unsaturated monohydric alcohol include the same as those cited in (b).

The (meth)acrylate oligomers cited in (a) to (d) may be used as they are or in combinations with (meth)acrylate monomers such as methyl methacrylate.

The (meth)acrylate oligomers preferably have a molecular weight of 200 or more. With a molecular weight below 200, the oligomers deteriorate the physical properties of hardened films and are therefore undesirable.

(e) Polymer having (meth)acryloyl groups in side chains

There are several methods of synthesizing such polymers and several kinds of polymers. Such polymers are generally synthesized from (i) polymerizable monomers described below, (ii) polymerizable monomers having functional groups for introducing (meth)acryloyl groups in the monomers in (i) (for example, acid anhydride groups, carboxylic acid groups, hydroxyl groups or epoxy groups) and polymerizable double bonds, and (iii) compounds having reactive groups with the above-described functional groups of the monomers (ii) (for example, hydroxyl groups, epoxy groups or NCO groups) and (meth)acryloyl groups.

The monomers (i) forming part of the main chain of the polymer need not be particularly limited. Typical examples of the monomers (i) include styrene, vinyltoluene, chlorostyrene, acrylates, methacrylates, acrylonitrile, vinyl choride, vinylidene chloride, vinylpyrrolidone, and vinyl acetate.

Typical examples of the monomers in (ii) which form part of the main chain of the polymer and have functional groups for introducing (meth)acryloyl groups into the side chains include acrylic acid, methacrylic acid, maleic anhydride, itaconic anhydride, the unsaturated monohydric alcohols above described in (b), methylolacryloamide, glycidyl (meth)acrylate, and mono(-meth)acrylates of epoxy resins.

Typical examples of the compounds (iii) which introduce (meth)acryloyl groups into the side chains of the polymer include the above-described unsaturated monohydric alcohols which react with the acid anhydride groups in the polymer to introduce (meth)acryloyl groups into the side chains thereof; unsaturated epoxy compounds such as clycidyl (meth)acyrlate, particularly glycidyl methacrylate and mono(meth)acrylates of epoxy resins which react with the carboxyl groups at the side chains of the polymer to introduce (meth)acryloyl groups therein; isocyanatoethyl methacrylate; and unsaturated isocyanates which react with a hydroxyl group at side chains of the polymer. The above-described unsaturated isocyanates are obtained by reactions between unsaturated monohydric alcohols described in (b) and polyisocyanates. In this case, it is necessary that one mole of polyisocyanate be reacted with one or more moles of unsaturated monohydric alcohol, provided that the hydroxyl group of the alcohol be less than equivalent of the isocyanate group. For example, it is necessary that 1 mole of diisocyanate be reacted with 1.1 to 1.8 moles of unsaturated alcohol to cause NCO groups to remain. The remaining NCO groups are employed in the reaction with the hydroxyl groups in the side chain of the polymer obtained from the monomers in (i) and (ii).

Typical examples of the polymer (A) having (meth)acryloyl groups in side chains are produced by the following methods:

(a) A polymer having acid anhydride structures in the structure thereof is reacted with an alcohol having (meth) acryloyl groups:

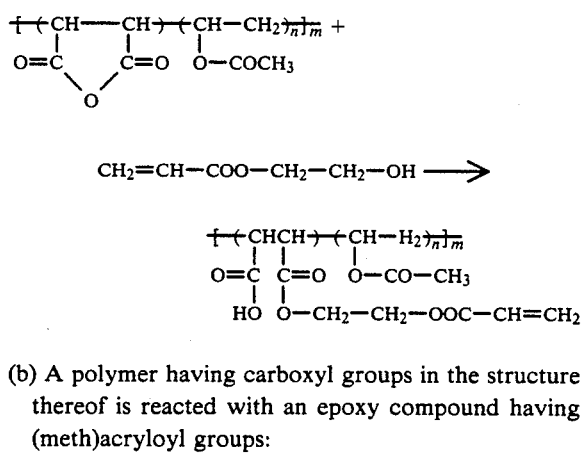

(b) A polymer having carboxyl groups in the structure thereof is reacted with an epoxy compound having (meth)acryloyl groups:

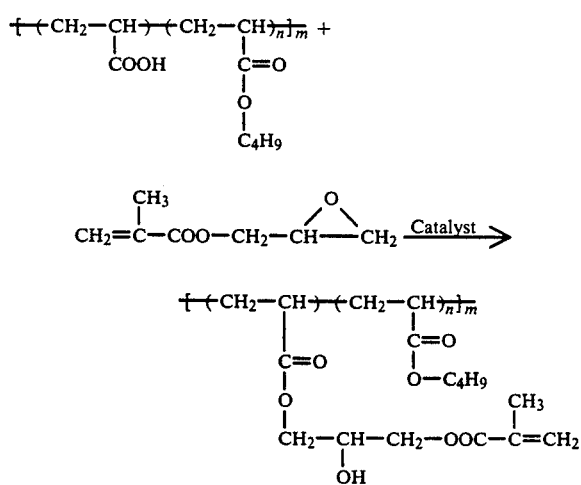

(c) A polymer having hydroxyl groups in the structure thereof is reacted with an unsaturated isocyanate compound having an isocyanate group and (meth)acryloyl group in its molecule:

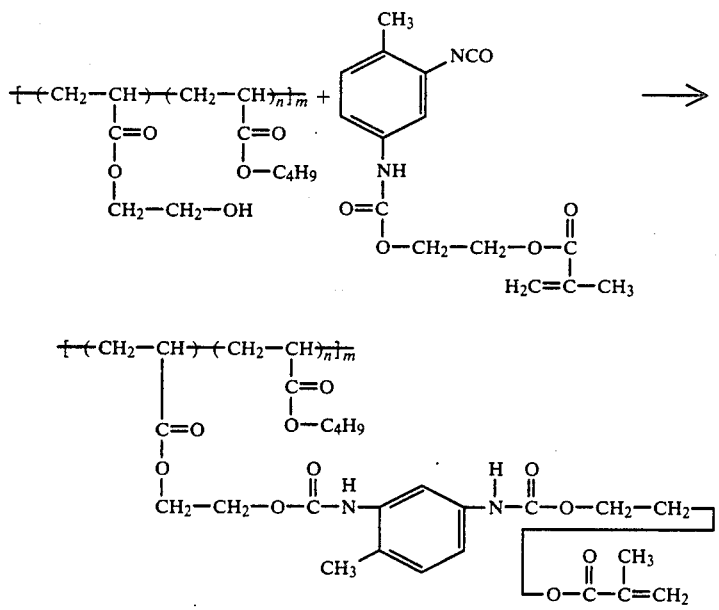

Of the above-described example polymers, a polymer in (c) which is obtained by reacting a polymer having hydroxyl groups with an unsaturated isocyanate compound and which has (meth)acryloyl groups in side chains thereof through urethane bonds is most desirable.

Polymers having (meth)acryloyl groups in the side chains thereof have high molecular weights (about 10,000 to 200,000) and are thus generally used in combination with solvents or monomers.

Examples of the white pigment which is used in the present invention include titanium white, zinc white, calcium carbonate and magnesia, which are available on the market and, which can be used in combination of two or more pigments. Of these white pigments, titanium white, which is rutile-type or anatase-type titanium dioxide, is most desirable. It is preferable that the amount of the white pigment used be within the range of 5 to 100 parts by weight relative to 100 parts by weight of the component (A). The use of the white pigment in an amount of below 5 parts by weight enables photocuring by using a conventional sensitizer such as acylophosphine oxide or dialkylbenzyl ketal and deteriorates the whiteness of the product. The use of the pigment in an amount of above 100 parts by weight is meaningless from the viewpoint of tinting and therefore is not suitable.

The photo-initiator used in the present invention is used in combination with the aforementioned compound which can generate radicals in order to further improve the photocuring property. The photo-initiators that can be used are not particularly limited and initiators available on the market may be satisfactorily used. Examples of photo- initiators include benzoin ethers such as isobutyl benzoin ether, isopropyl benzoin ether, benzoin ethyl ether and benzoin methyl ether; α-acryloxime esters such as 1-phenyl- 1,2-propadione-2-(O-ethoxycarbonyl)oxime; benzyl ketals such as 2,2-dimethoxy-2-phenylacetophenone and hydroxycyclohexyl phenyl ketone; acetophenone derivatives such as diethoxyacetophenone and 2-hydroxy-2-methyl-1-phenylpropane- 1-one; and ketones such as benzophenone, benzil, methyl-o-benzoin benzoate, 2-chlorothioxantone, isopropylthioxantone, 2-methylthioxantone, and chlorine-substituted benzophenone.

Of these compounds, 2,2-dimethoxy-2-phenylacetophenone, hydroxycyclohexyl phenyl ketone and 2-hydroxy-2-methyl-1-phenylpropane-1-one exhibit excellent photocuring properties when used in combination with the above-described compound, which can generate radicals, and are thus most suitable for the photocurable resin composition of the present invention.

The amount of the photo-initiator used is preferably within the range of 0.01 to 5 parts by weight relative to 100 parts by weight of a polymer or oligomer having (meth)acryloyl groups. In particular, the photo-initiator is preferably used in an amount of 0.5 to 3 parts by weight and within the range of 3 to 7 times the amount of the radical-generating compound used.

Non-white inorganic substrates that can be used in the method of the present invention are not particularly limited so far as they are inorganic substrates of colors other than white. However, typical examples include cement-based substrates mainly composed of cement such as substrates which are colored building materials using Portland cement and which are required to have excellent whiteness and patterns or color tones with excellent hiding power.

Preferable examples of printed films that may be used in the present invention include plastic films, and polypropylene, polyethylene, polyethylene terephthalate films are easily used from the viewpoint of cost and handling properties. Cellophane and acetal-modified polyvinyl alcohol films, for example, Vinylon (trade name, produced by Kuraway Co., Ltd.) can also be used as the printed film. It is a matter of course that other films can be used so far as they can adhere to a curable resin and separate therefrom and not dissolve or swell excessively when in contact with the curable resin. In addition, films which are subjected to surface treatment for improving the adhesive properties thereof to a printing ink may be used as the films.

Any inks having greater affinity for the curable resin than for the film may be used as the printing ink in the present invention. In other words, the printing ink is not particularly limited but should have greater adhesion to the curable resin than to the film.

In practice, the objects of the present invention can be sufficiently achieved by using the usual oil inks that are used in gravure printing or offset printing.

Any types of polymers or oligomers which are soluble in organic solvents can be used as vehicles for the printing ink.

Examples of such polymers or oligomers include the following types:

Styrene-maleic acid copolymers and polymers or oligomers containing third components, polyamide resins, polybutene, xylene resins, chlorinated rubber, petroleum resins, 100% alkylphenol resins, oil-soluble phenol resins, ketone resins, ester gum, rosin-maleic acid resins, rosin-modified phenol resins, oil-modified alkyd resins, drying natural oil and polymerized oil, epoxy resins, and cellulose derivatives.

Examples of polymers or oligomers other than the above-described ones that may be used include polymer latexes which are aqueous dispersions but which produce dry films exhibiting a lipophilic nature and polymers such as methyl cellulose, hydroxyethyl cellulose, methylhydroxypropyl cellulose, polyvinyl pyrrolidone and polyvinyl methyl ether which are water-soluble as well as soluble in organic solvents.

In particular, certain types of polymers to which coloring agents are added and which are not usually used in printing inks and are soluble in organic solvents can also be used if a suitable method of printing is selected or if handwriting is employed.

Photocurable vehicles which have been increasingly used in recent years can also be used. Such vehicles are mainly composed of unsaturated acrylate resins as main components, such as polyester-acrylate, vinyl ester resins, epoxy-acrylate, urethane-acrylate or spiroacetal acrylate; polyacrylates of polyhydric alcohols which are mixed with the resins in required amounts; and photo-sensitizers.

Polymers which are water-soluble and insoluble in organic solvents are unsuitable as vehicles. This is because such polymers are not easily used in printing on usual films and prints on hydrophilic films generally do not adhere to the cured surface of a lipophilic resin.

However, if the original curable resin is made hydrophilic or water-soluble, transfer can be performed at the same time as curing of the resin. However, particularly, if such a hydrophilic resin is cured in a state wherein it contains water to some extent, generally, shrinkage is increased, and troubles such as cracks or shrink-marks are increased, leading to the difficulty in obtaining priority of practical use.

As a matter of course, inks using water-soluble resins as vehicles can be used if hydrophilic curable resins are selected. However, there is a problem with respect to performance of the resins and thus no particular advantages. Printing inks using vehicles such as polyvinyl pyrrolidone which have both lipophilic and hydrophilic natures can be used according to circumstances.

The term of "printing" in the present invention means that a pattern or color tone is described on a desired film by a machine or hand.

In the present invention, the photocurable resin composition comprising a polymer or oligomer having (meth)acryloyl groups, a white pigment, a compound with a half-life temperature of 60° C. or lower which can generate radicals, and a photo-initiator is applied on a non-white inorganic substrate by using a knife coater, sponge roll or bar coater in such a manner that the thickness is about 10 to 1000 μ, the printed film is then placed on the substrate so that the printed surface adheres to the coated surface thereof before the resin is cured, and the photocurable resin is then cured by irradiation of light using an incandescent lamp, mercury lamp, infrared lamp, ultraviolet fluorescent lighting, carbon arc, or xenon lamp, as well as the pattern or color tone printed on the film being transferred to the cured surface and the film being removed, so that a decorative material with the pattern or color tone which exhibits excellent whiteness and hiding power can be obtained. In addition, in the method of the present invention, the photocurable resin composition is applied to the printed film which is then adhered to the non-white inorganic substrate, and the photocurable resin is then subjected to photocuring so that the pattern or color tone can be transferred.

It is also possible to obtain a decorative material having an excellent appearance by topcoating of the surface of the decorative material obtained by the method of the present invention. Transparent to translucent resins can be used as topcoatings, and such resins are divided into curable resins and thermoplastic resins.

Examples of curable resins include the above-described polymers or oligomers having (meth)acryloyl groups, as well as unsaturated polyester resins, epoxy resins, urethane resins or phenolic resins. The thermoplastic resins are required to be soluble in solvents and have good film-forming properties and form a film having a good practical properties such as hardness. The thermoplastic resins include styrene homopolymers or copolymers, methyl methacrylate homopolymers or copolymers, vinyl chloride-vinyl acetate copolymers, copolymers added maleic anhydride thereto and cellulose esters. These polymers are used in the form of a solution of an appropriate organic solvent or an aqueous emulsion.

EXAMPLES

Examples are described below for the purpose of facilitating the comprehension of the present invention. In the examples, "parts" means parts by weight.

EXAMPLE 1

(1) Synthesis of vinyl ester resin (A)

350 g of DER-332 of Dow Co., Ltd. as an epoxy resin, 144 g of acrylic acid, 1.5 g of trimethylbenzyl ammonium chloride, and 0.15 g of methylhydroquinone were charged in a 1-l separatory flask with an agitator, a reflux condenser, and a thermometer. The obtained mixture was heated at 120° to 130° C. for 3 hours until the acid value was 4.1. 406 g of trimethylolpropane triacrylate was added to the mixture to obtain a vinyl ester resin (A) with a Harzen color number of 350 and a viscosity of about 60 poise.

(2) Synthesis of polyurethane-acrylate (B)

232 g of 2-hydroxyethyl acrylate, 600 g of phenoxyethyl acrylate and 348 g of 2,4-trirenediisocyanate were charged in a 2l separatory flask with an agitator, a reflux condenser, a gas inlet tube and a thermometer. The obtained mixture was then subjected to reaction in a stream of dry air at 60° C. for 3 hours. As a result of infrared analysis, it was determined that 57% of isocyanate groups were reacted.

220 g of dipropylene glycol, 2 g of dibutyltin dilaurate and 0.2 g of parabenzoquinone were then added to the reaction solution, and the thus-obtained mixture was subjected to reaction at 60° C. for 5 hours. As a result of infrared analysis, it was found that free isocyanate groups were completely reacted.

The obtained polyurethane acrylate (B) had a light red color and a viscosity of 29 poise.

(3) Synthesis of polyester-acrylate (C)

280 g of glycidyl methacrylate, 296 g of phthalic anhydride, 104 g of neopenthyl glycol, 2 g of trimethylbenzyl ammonium chloride and 0.5 g of hydroquinone were charged in a 1-l separatory flask with an agitator, a reflux condenser and a thermometer. The obtained mixture was subjected to reaction at 130° to 135° C. for 3 hours until the acid value was 9.1. 420 g of cresol ethyl acrylate was then added to the reaction solution to obtain a polyester acrylate (C) with a Harzen color number of 450 and a viscosity of 11.4 poise.

(4) Synthesis of spiroacetal acrylate (D)

222 g of diallylidene pentaerythritol, 232 g of 2-hydroxyethyl acrylate and 4.5 g of paratoluenesulfonic acid were charged in a 1-l separatory flask with an agitator, a reflux condenser and a thermometer. The obtained mixture was then subjected to reaction at 60° to 65° C. for 10 hours. As a result of infrared analysis, it was found that unsaturated bonds of diallylidene pentaerythritol completely disappeared.

After the odor of free acrolein had been removed by adding 5 g of triethylamine to the reaction solution, the reaction solution was washed with 300 g of a solution of 1% sodium carbonate and then 200 g of distilled water three times.

Then, the reflux condenser was replaced by a fractionating condenser so that water was removed at 10 to 12 mmHg and 65° to 70° C.

400 g of trimethylolpropane triacrylate and 0.1 g of methylhydroquinone were added to the residue to obtain a spiroacetal acrylate (D) with a Harzen color number of 300 and a viscosity of 5.4 poise.

(5) Synthesis of polymer (E) having methacryloyl groups in side chains 104 g of styrene, 26 g of 2-hydroxyethyl methacrylate, 115 g of isobutyl methacrylate, 2.4 g of t-dodecyl mercaptan, 2.4 g of azobisisobutyronitrile and 240 g of methyl ethyl ketone were charged in a 1-l of separatory flask with an agitator, a gas inlet tube, a reflux condenser and a thermometer. The obtained mixture was then subjected to polymerization in a stream of nitrogen at 65° to 70° C. for 12 hours.

1.2 g of azobisisobutyronitrile was added to the polymerization solution every four hours in the course of polymerization.

The polymerization was stopped by adding 0.2 g of hydroquinone.

The rate of polymerization was 91%. As a result of GPC analysis, it was found that a polymer which had a molecular weight distribution with a peak at about 27000 and had hydroxyl groups in the side chains thereof was obtained.

Then, 31 g of isocyanatoethyl methacrylate produced by Dow Chemical Co., Ltd of U.S.A and 1 g of dibutyltin dilaurate were added to the thus-obtained polymer. The obtained mixture was then subjected to reaction at 75° to 80° C. for 6 hours. In infrared analysis, absorption of isocyanate groups completely disappeared.

The reflux condenser was replaced by a fractionating condenser so that about 100 cc of methyl ethyl ketone was distilled off at normal pressure, and 330 g of phenoxyethyl acrylate was then added to the residue. The thus-obtained mixture was then heated at 70° to 75° C. under reduced pressure of 100 to 150 mmHg so that methyl ethyl ketone was distilled off until the amount of methyl ethyl ketone remaining was 0.2% or less. In this case, the amount of remaining methyl ethyl ketone was measured by gas chromatography analysis.

The thus-obtained polymer (E) (monomer solution) having methacryloyl groups in the side chains thereof had a Harzen color number of 200 and a viscosity of 21.7 poise.

80 parts of titanium white, 0.3 part of 2,2-azobis(4-methoxy-2,4-dimethylvaleronitrile) (trade name: V-70, produced by Wako Junyaku Kogyo K. K.) and 1 part of hydroxycyclohexyl phenyl ketone (Irgacure #184 produced by Ciba Geigy Co., Ltd.) were kneaded with 100 parts of each of the above-described resins by using three rolls to form each of coating resin samples (1) to (5).

Separately, 0.3 part of V-70 alone and 1 part of Irugacure #184 of Ciba Geigy Co., Ltd. and 0.5 part of dimethylaminoethanol were added to each of the mixture of 80 parts of titanium white and 100 parts of each of above-described resins to prepare additional samples.

Each of the resin systems was coated on a slate plate of 200 mm × 150 mm × 5 mm which was composed of asbestos. cement by a bar coater so that the thickness was 100 μ.

The temperature of each of the plates was kept at 25 to 30° C. Each of the plates was passed at a speed of 1.5 m/min through a portion 15 cm below a lamp in an ultraviolet irradiator with an output of 50 kW. The time required for irradiation was about 1 minute.

The temperature of each of the coated plates after being removed from the irradiator was within the range of 55° to 60° C.

The obtained results are given in Table 1. Each of the systems containing V-70 as a radical-generating compound and Irgacure as a photo-initiator was completely cured. Each of the systems containing V-70 only was also cured and could thus stand practical use. However, the systems containing a photo-initiator "Irgacure #184" only were not cured sufficiently.

TABLE 1

| Resin type | Initiator type | | | | | |
|---|---|---|---|---|---|---|
| | V-70 (0.3 part), Irgacure #184 (1 part) | | V-70 (0.3 part) | | Irgacure #184 (1 part), dimethyl-aminoethanol (0.5 part) | |
| | Cross-cut adhesion test | Pencil test | Cross-cut adhesion test | Pencil test | Cross-cut adhesion test | Pencil test |
| Sample (1) Vinyl ester (A) | 100/100 | 3–4 H | 86/100 | 2–3 H | Only thin layers at the surfaces were cured, and the insides were not cured. Thus, physical properties could not be measured. | |
| Sample (2) Urethane acrylate (B) | 100/100 | 3 H | 80/100 | 2 H | | |
| Sample (3) Polyester acrylate (C) | 98/100 | 3 H | 50/100 | 2–3 H | | |
| Sample (4) Spiroacetal acrylate (D) | 100/100 | 4 H | 78/100 | 3–4 H | | |
| Sample (5) Side chain methacryloyl group-containing polymer (E) | 100/100 | 4 H | 85/100 | 3 H | | |

EXAMPLE 2

Each of the coating resin samples prepared in Example 1 was coated on an asbestos slate plate of 200 mm × 150 mm × 5 mm by a bar coater so that the thickness was 200 μ. Immediately, a polyethylene terephthalate film with a thickness of 50 μ on which a Kashmir onyx pattern was printed by baby printing of gravure printing was laid on each of the plates so that the pattern adhered to the each of the resins. Each of the plates was passed at a speed of 2 m/min through a portion 20 cm below a lamp in an ultraviolet irradiator with an output of 50 kW. The time required for irradiation was about 1 minute.

The temperature of each of the asbestos slate plates before it was entered in the irradiator was 32° C. and that after it had been get out of the irradiator was 62° C.

Each of the coated films was completely cured and, after each of the films had been separated, the onyx pattern was transferred to each of the white cured films.

The obtained results are given in Table 2. The systems using V-70 combined with Irgacure or using V-70 solely were completely or satisfactorily cured and could thus stand practical use.

A photocurable resin comprising 100 parts of spiroacetal acrylate (D) which was used in the sample (4) and 1 part of Darocure #1173 produced by Merck Co., Ltd. was then coated as a topcoat on each of the systems by using a flow coater so that the thickness of about 100 μ. Each of the systems was then passed at a speed of 5 m/min through a portion 20 cm below a lamp in an ultraviolet irradiator with an output of 50 kW so that the photo-setting resin was cured.

In each of the systems using V-70 combined with Irgacure or using V-70 solely, a beautiful decorative plate with a hardness of 4 to 5 H was obtained.

TABLE 2

| Resin type | Initiator type | | | | | |
|---|---|---|---|---|---|---|
| | V-70 (0.3 part), Irgacure #184 (1 part) | | V-70 (0.3 part) | | Irgacure #184 (1 part), dimethyl-aminoethanol (0.5 part) | |
| | Cross-cut adhesion test | Pencil test | Cross-cut adhesion test | Pencil test | Cross-cut adhesion test | Pencil test |
| Sample (1) Vinyl ester (A) | 100/100 | 3 H | 76/100 | 2 H | Only thin layers at the surfaces were cured, and the insides were not cured. Thus, physical properties could not be measured. | |
| Sample (2) Urethane acrylate (B) | 100/100 | 3 H | 80/100 | 2 H | | |
| Sample (3) Polyester acrylate (C) | 98/100 | 3 H | 71/100 | 2 H | | |
| Sample (4) Spiroacetal acrylate (D) | 100/100 | 4 H | 58/100 | 3 H | | |
| Sample (5) Side chain methacryloyl group-containing | 100/100 | 4 H | 81/100 | 3 H | | |

TABLE 2-continued

| | Initiator type | | | | | |
|---|---|---|---|---|---|---|
| | V-70 (0.3 part), Irgacure #184 (1 part) | | V-70 (0.3 part) | | Irgacure #184 (1 part), dimethyl-aminoethanol (0.5 part) | |
| Resin type | Cross-cut adhesion test | Pencil test | Cross-cut adhesion test | Pencil test | Cross-cut adhesion test | Pencil test |
| polymer (E) | | | | | | |

EXAMPLE 3

Synthesis of polymer (E') having (meth)acryloyl groups in side chains

Production of unsaturated epoxy resin (a)

360 g (1 mole) of Epicoat 827 produced by Yuka-Shell Epoxy Co., Ltd., 43 g (0.5 mole) of methacrylic acid, 1.2 g of benzyldimethylamine and 0.08 g of para-benzoquinone were charged in a 1-1 separatory flask with an agitator, a thermometer with a gas inlet tube, a reflux condenser and a dropping funnel. The obtained mixture was then subjected to reaction under a condition of air blowing at 120° to 130° C. for 3 hours until the acid value was substantially zero to obtain a light reddish brown unsaturated epoxy resin (a) in a syrupy form.

On calculation, the obtained resin (a) was mixture of 180 g of free epoxy resin and 223 g of a compound expressed by the following formula:

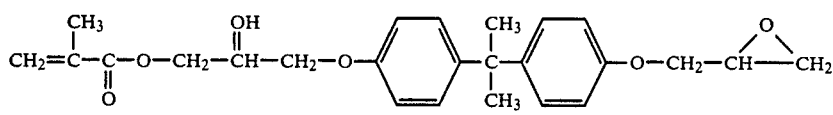

Synthesis of side chain epoxy resin (b)

250 g of methyl ethyl ketone, 173 g (0.2 mole) of the unsaturated epoxy resin (a), 100 g of styrene and 3.5 g of azobisisobutyronitrile were charged in the same flask as that described above. 87 g (total amount of styrene: 1.8 moles) of styrene was then added dropwise to the obtained mixture in a stream of nitrogen at 75° C.

After 6 hours had passed, 2 g of azobisisobutyronitrile was further added to the mixture, followed by polymerization for 10 hours.

When the rate of polymerization reached 96%, the polymerization was stopped by adding 0.2 g of hydroxyquinone.

A light yellowish brown liquid of a methyl ethyl ketone solution (solid content: 40%) of a side chain epoxy resin (b) was obtained.

As a result of GPC analysis, it was found that the obtained resin was mixture of an unreacted epoxy resin and a polymer having a molecular weight distribution with a peak at about 50,000.

Synthesis of polymer (E') having (meth)acryloyl groups in side chain 52 g (0.60 mole) of methacrylic acid and 0.8 g of triphenylphosphine were added to the entire amount of the methyl ethyl ketone solution of the side chain epoxy resin (b). The obtained mixture was then subjected to reaction for 16 hours at a temperature of the boiling point of methyl ethyl ketone until the acid value was 10.4. 620 g of phenoxyethyl acrylate was then added to the reaction solution, and the thus-obtained mixture was heated under reduced pressure of 400 to 450 mmHg so that methyl ethyl ketone was removed.

After about 6 hours had passed, when the result of gas chromatography analysis showed that methyl ethyl ketone was 0.3%, the heating was stopped to obtain a side chain unsaturated bond-type resin (E') with a yellowish brown color and a viscosity of 8.5 poise.

50 parts of titanium white and 50 parts of calcium carbonates were added to 100 parts of the resin (E') and kneaded therewith, and the obtained mixture was then divided into two parts. 0.5 part of 2,2'-azobis(2,4dimethylvaleronitrile (V-65 produced by Wako Junyaku Kogyo K. K.) and 2 parts of 2-hydroxy-2-methyl-1-phenylpropane-1one (Darocure #1173 produced by Merck Co., Ltd.) were added to one of the two parts to form a sample (6).

Separately, 0.5 part of azobisisobutyronitrile was solely added to the other part to form a sample (7).

Each of the samples (6) and (7) was coated by a bar coater on a slate plate with a thickness of 5 mm at a temperature of 30° C. in such a manner that the thickness of the coating was 70 μ, and transfer was then performed in the same method as employed in Example 1.

The coating film of the sample (6) was completely cured, and after the film had been separated, the onyx pattern was transferred to the white cured film. The physical properties of the samples are shown in Table 3.

TABLE 3

| | Physical property | | |
|---|---|---|---|
| Resin type | Hardness | Cross-cut adhesion | Cross-cut |
| Sample (6) | 3 H | 100/100 | Pass |
| Sample (7) | The inside was not cured and measurements were thus impossible. | | |

When a sample containing V-65 alone was equivalent to those obtained by the sample (6) was obtained at a passage speed of 1 m/min which was half the speed of the sample (6), and it was thus determined that the speed of photocuring was about ½ of that of the sample (6).

EXAMPLE 4

100 parts of titanium white and 1 part of bis-(4-t-butylcyclohexyl) peroxydicarbonate (trade name: Percadox #16, produced by Kayaku Nuri Co., Ltd.) were uniformly kneaded by rolls with 100 parts of the vinyl ester resin (A) produced in Example 1. The thus-obtained mixtured was coated on a hardened cement mortar plate at 30° C. so that the thickness of the coating was 100 $\mu$. The coated plate was then passed at a speed of 1 m/min through a portion 20 cm below an ultraviolet irradiator with an output of 50 kW.

The time required for passing the plate was about 100 seconds. The temperature of the film after the plate had been get out of the irradiator was 67° C. The film was completely cured, had hardness at 23° C. of 3 to 4 H, passed the test of cross-cut adhesion and showed a value of 100/100 in the cross-cut adhesion test.

When the same coated plate was allowed to stand in a thermostatic chamber at 60° to 65° C., the film was gelled after 30 minutes had passed, but the degree of gelation was such that the film was could be damaged by a nail (2B or less). In order to attain the hardness equivalent to that obtained by photo-setting, further curing at 80° C. for 1 hour was required.

EXAMPLE 5

100 parts of the spiroacetal acrylate (D) synthesized in Example 1 as a photocurable adhesive, 3 parts of dimethylaminoethyl methacrylate, 1.5 parts of Perkadox #16 produced by Kayaku Nuri Co., Ltd., 70 parts of titanium white and 50 parts of hydrated alumina were uniformly kneaded by rolls. The thus-obtained mixture was then coated on a film on which a Kashmir onyx pattern was printed in such a manner that the thickness of the coating was about 70 to 80 $\mu$. The film was then adhered to a magnesium carbonate plate of 300×300×10 mm.

The plate was passed through a portion 20 cm below a lamp in an ultraviolet irradiator with an output of 50 kW at a speed of 1 m/min.

When the temperature of the plate before irradiation was 36° C, the temperature of the plate after it had been get out of the irradiator was 73° C, and the time required for irradiation was about 100 seconds.

When the film was removed, a plate in which the Kashmir onyx pattern was transferred to a white base was obtained.

Furthermore, curable polyurethane paint (Acryc 2026GL Clear, produced by Kansai Paint Co., Ltd.) was coated as a topcoat on the plate by a spray so that the thickness of the coating was 70 $\mu$.

When the coated plate was abraded after 1 day, a product having an appearance of a beautiful rised pattern was obtained.

EXAMPLE 6

100 parts of the urethane acrylate (B) produced in Example 1, 90 parts of titanium white, 2 parts of 2-hydroxy-2-methyl-1-phenylpropane-1-one (Darocure #1173 produced by Merck Co., Ltd.) and 1.5 parts of each of the compounds described below were kneaded by using three rolls to form a uniform paste.

(i) Sample (8)

t-butyl peroxypivalate (Perbutyl PV produced by Nippn Oils & Fats Co., Ltd.)

(ii) Sample (9)

t-butyl peroxyneodecanoate (Perbutyl ND produced by Nippon Oils & Fats Co., Ltd.)

(iii) Sample (10)

dimyristyl peroxydicarbonate (Perroyl MSP produced by Nippon Oils & Fats Co., ltd.)

Each of the samples was coated on a slate plate which was cut into a form of 1.6 mm thick and 300×300 mm so that the thickness of the coating was about 200 $\mu$, and a polyethylene terephthalate film with a thickness of 50 $\mu$ on which a Kashmir onyx pattern was printed was adhered to each of the plates. A roll was applied to the plate so that the thickness of the coated layer was about 100 $\mu$, and the plate was then passed through a portion 20 cm below a lamp in an ultraviolet irradiator with an output of 50 kW at a speed of 2 m/min.

The temperature of each of the plates before it entered the irradiator was 26° C, and the temperature thereof immediately after it had been get out of the irradiator was 57° C.

Each of the coated layers was cured, and when each film was separated, the onyx pattern was completely transferred to the surface of each of the coated layers.

A photocurable resin comprising 100 parts of the spiracetal acrylate (D) produced in Example 1 and 1 part of Darocure $\pi$1173 produced by Merck Co., Ltd. was coated by a flow coater on the obtained each of the plates with the patterns so that the thickness of coating was about 100 $\mu$. Each of the coated plates was passed through a portion 20 cm below a lamp in an ultraviolet irradiator with an output of 50 kW at a speed of 5 m/min so that the photocurable resin was cured.

In any one of the cases, a decorative plate with a beautiful onyx pattern and hardness of 4 H was obtained.

The present invention enables to increase curing efficiency of a photocurable resin system which comprises a large amount of white color inorganic pigment by using a particular compound which can generate radicals in combination with a photo-initiator. The present invention also enables rapid transfer of a pattern or color tone having excellent whiteness and hiding power to a non-white inorganic substrate from a printed film by photocuring, such transfer being not easily realized by conventional photocuring systems. In addition, the obtained decorative materials are extremely useful in applications as building materials or decorative members.

What is claimed is:

1. A photocurable resin composition comprising a combination of the following three components:
    (A) a curable polymer or oligomer of spiroacetal(-meth)acrylate;
    (B) a white pigment; and
    (C) a radical-generating compound having a half-life of 10 hours at a decomposition temperature of 60° C. or less.

2. A photocurable resin composition comprising the following components:
    (A) a curable polymer or oligomer of spiroacetal(-meth)acrylate;
    (B) a white pigment;
    (C) a radical-generating compound having a half-life of 10 hours at a temperature of 60° C. or less; and
    (D) a photo-initiator.

3. The photocurable resin composition of claim 1 or 2, wherein said radical-generating compound is an azo compound or an organic peroxide.

4. A photocurable resin composition, comprising the combination of the following four components;
(A) a curable polymer or oligomer of spiroacetal(meth)acrylate;
(B) a white pigment;
(C) an azo compound having a half-life of 10 hours at a decomposition temperature of 60° C. or less; and
(D) a photo-initiator.

5. The photocurable resin composition according to claim 4, wherein said white pigment is titanium white.

6. The photocurable resin composition according to claim 4, wherein said azo compound is 2,2'-azobis(2,4-dimethylvaleronitrile) or 2,2'-azobis(4-methoxy-2,4-dimethylvaleronitrile).

7. The photocurable resin composition according to claim 4, wherein the amount of said azo compound in the composition ranges from 0.03–5 parts by weight per 100 parts by weight of said curable polymer or oligomer.

8. A photocurable resin composition comprising:
(a) a curable polymer or oligomer of spiroacetal(meth)acrylate;
(b) titanium white;
(c) 2,2-azobis(2,4-dimethylvaleronitrile) having a half-life temperature of 51° C.; and
(d) hydroxycyclohexylphenylketone.

* * * * *